United States Patent
Laermer

(10) Patent No.: US 8,382,940 B2
(45) Date of Patent: Feb. 26, 2013

(54) DEVICE AND METHOD FOR PRODUCING CHLORINE TRIFLUORIDE AND SYSTEM FOR ETCHING SEMICONDUCTOR SUBSTRATES USING THIS DEVICE

(75) Inventor: Franz Laermer, Weil Der Stadt (DE)

(73) Assignee: Robert Bosch GmbH, Stuttgart (DE)

( * ) Notice: Subject to any disclaimer, the term of this patent is extended or adjusted under 35 U.S.C. 154(b) by 2060 days.

(21) Appl. No.: 10/519,724

(22) PCT Filed: Mar. 27, 2003

(86) PCT No.: PCT/DE03/01014
§ 371 (c)(1),
(2), (4) Date: Dec. 28, 2004

(87) PCT Pub. No.: WO2004/002882
PCT Pub. Date: Jan. 8, 2004

(65) Prior Publication Data
US 2006/0006057 A1    Jan. 12, 2006

(30) Foreign Application Priority Data
Jun. 28, 2002   (DE) .................................. 102 29 037

(51) Int. Cl.
| | |
|---|---|
| *C23C 16/00* | (2006.01) |
| *C23F 1/00* | (2006.01) |
| *H01L 21/306* | (2006.01) |
| *C03C 15/00* | (2006.01) |
| *C03C 25/68* | (2006.01) |
| *B44C 1/22* | (2006.01) |

(52) U.S. Cl. ......... 156/345.35; 156/345.48; 156/345.36; 156/345.41; 118/723 MW; 118/723 ME; 216/67

(58) Field of Classification Search ................ 118/723 I, 118/723 MW, 723 ME; 216/67; 438/710; 156/345.48, 345.35, 345.36, 345.41
See application file for complete search history.

(56) References Cited

U.S. PATENT DOCUMENTS
(Continued)

FOREIGN PATENT DOCUMENTS
| DE | 43 17 623 | 12/1994 |
|---|---|---|
| DE | 199 19 469 | 11/2000 |

(Continued)

OTHER PUBLICATIONS

Suto et al—Highly Selective Etching of Si3N4 to SiO2 Employing Fluorine and Chlorine Atoms Generated by Microwave Discharge—J. Electrochem. Soc., vol. 136, No. 7, Jul. 1989.*

(Continued)

*Primary Examiner* — Rakesh Dhingra
(74) *Attorney, Agent, or Firm* — Kenyon & Kenyon LLP

(57) ABSTRACT

A device (6) and a method for generating chlorine trifluoride is described, a high-density plasma (105) being generated in the interior of a plasma reactor (100) using plasma generating means (110, 120, 130, 150, 155, 160, 170, 180), and a first gas and a second gas, which react with one another under the influence of the high-density plasma (105) in the plasma reactor (100) under the formation of chlorine trifluoride, being supplied to the plasma reactor (100) via gas supply means (21, 22, 25, 26). In addition, a gas outlet (20) is provided, via which the generated chlorine trifluoride can be removed from the plasma reactor (100). Finally, a system (5) for etching semiconductor substrates (30), silicon wafers in particular, is described including such an upstream device (6), the system (5) having a process chamber (10) which is connected to the plasma reactor (100) via the gas outlet (20), and the semiconductor substrate (30) being situated in the process chamber (10) and exposed to the gaseous chlorine trifluoride generated by the device (6).

18 Claims, 2 Drawing Sheets

U.S. PATENT DOCUMENTS

| | | | | |
|---|---|---|---|---|
| 3,354,646 | A | * | 11/1967 | Maya et al. .................... 60/211 |
| 4,472,254 | A | | 9/1984 | Dotson et al. |
| 5,047,115 | A | * | 9/1991 | Charlet et al. ................. 216/64 |
| 5,641,380 | A | * | 6/1997 | Yamazaki et al. ............ 438/304 |
| 5,741,396 | A | | 4/1998 | Loewenstein ................ 438/724 |
| 5,756,400 | A | * | 5/1998 | Ye et al. ....................... 438/710 |
| 5,814,365 | A | * | 9/1998 | Mahawili ....................... 427/10 |
| 6,042,654 | A | * | 3/2000 | Comita et al. .................... 134/2 |
| 6,136,214 | A | * | 10/2000 | Mori et al. ...................... 216/67 |
| 6,190,507 | B1 | | 2/2001 | Bigelow et al. |
| 6,274,058 | B1 | * | 8/2001 | Rajagopalan et al. ......... 216/67 |
| 6,340,863 | B1 | | 1/2002 | Ikeda et al. |
| 6,783,627 | B1 | * | 8/2004 | Mahawili ................ 156/345.38 |
| 6,929,784 | B1 | * | 8/2005 | Bhardwaj et al. ............. 422/188 |
| 6,953,557 | B1 | * | 10/2005 | Ikeda et al. ................... 423/210 |
| 2001/0007275 | A1 | * | 7/2001 | Yanagisawa et al. ......... 156/345 |
| 2002/0074946 | A1 | | 6/2002 | Ikeda et al. |

FOREIGN PATENT DOCUMENTS

| | | |
|---|---|---|
| GB | 2 332 302 | 6/1999 |
| JP | 08-153711 | 6/1996 |
| JP | 2000-133494 | 5/2000 |
| JP | 2001 267241 | 9/2001 |
| WO | 00 51938 | 9/2000 |
| WO | WO 00/52740 | 9/2000 |

OTHER PUBLICATIONS

Joudan et al., "Recent Developments in Fluorine Chemistry for Microelectronic Applications—Some Examples at Comurhex", Journal of Fluorine Chemistry, Elsevier Seguoia, Lausanne, CH, Bd. 107, Nr. 2, Feb. 2001, pp. 255-264, XP004315006, ISSN: 0022-1139, p. 260-262.

Hofmann-Rüdorff, "Textbook of Inorganic Chemistry", 21$^{st}$ Edition, 1973, pp. 259 et. sqq.

* cited by examiner

DEVICE AND METHOD FOR PRODUCING CHLORINE TRIFLUORIDE AND SYSTEM FOR ETCHING SEMICONDUCTOR SUBSTRATES USING THIS DEVICE

FIELD OF THE INVENTION

The invention relates to a device and a method for producing chlorine trifluoride and a system for etching semiconductor substrates, silicon wafers in particular, using this device according to the definition of the species in the independent claims.

DESCRIPTION OF RELATED ART

It is known from German Patent 199 19 469 or Japanese Patent 20010684422 that silicon is spontaneously etched using gaseous chlorine trifluoride ($ClF_3$) in that, subsequent to the absorption of this compound, fluoride radicals are released on a silicon surface, the fluoride radicals together with the silicon atoms of the accessible silicon surface reacting to spontaneously volatile silicon fluoride compounds. The etching rate increases with rising partial pressure of the $ClF_3$ in this process and removal rates of some 10 µm/min and more are possible at correspondingly high pressures and with a sufficient supply of material. However, this gas has the disadvantage that it is a very dangerous material, primarily when it is in liquefied form.

The synthesis of $ClF_3$ from $Cl_2$ and $F_2$ is known from the "Textbook of Inorganic Chemistry" (Lehrbuch der Anorganischen Chemie) by Hofmann-Rüdorff, 21 st edition, 1973, pages 259 et. sqq. At a temperature of 280° C., chlorine trifluoride is generated from a mixture of $Cl_2$ and $F_2$ with an excess of $F_2$. Chlorine monofluoride is formed in a first step, additional fluoride accumulating in a second step culminating in chlorine trifluoride.

The high reaction temperature and the low reaction rate are disadvantageous in this reaction. Therefore, only comparatively small quantities of $ClF_3$ may be synthesized in this way and a substantial portion of the supplied original gases $Cl_2$ and $F_2$ remains unused or was merely converted into interim products such as FCl.

SUMMARY OF THE INVENTION

It is an object of the invention to provide a device and a method for generating chlorine trifluoride, as well as a system for etching semiconductor substrates using this device, in which chlorine trifluoride is used as etching gas, the method and the device allowing generation of chlorine trifluoride directly on site so that stockpiling of this material which is critical with respect to safety aspects, in particular in liquid form, may be avoided.

It is a further object of the invention to generate the chlorine trifluoride from comparatively harmless or uncritical starting materials in an efficient and cost-effective manner in the exact quantity needed for etching.

These and other objects of the invention are achieved by a device for generating chlorine trifluoride using a plasma reactor (100) and plasma generating means (110, 120, 130, 150, 155, 160, 170, 180) via which a high-density plasma (105) can be generated in the interior of the plasma reactor (100), gas supply means (21, 25, 22, 26) being provided via which a first gas and a second gas can be supplied to the plasma reactor (100), these gases reacting with one another under the influence of the high-density plasma (105) in the plasma reactor (100), forming chlorine trifluoride, and a gas outlet (20) being provided via which the formed chlorine trifluoride can be removed from the plasma reactor (100).

BRIEF DESCRIPTION OF THE DRAWINGS

The present invention will be described in greater detail with reference to the following drawings wherein.

DETAILED DESCRIPTION OF THE INVENTION

The device according to the present invention has the advantage over the related art that chlorine trifluoride is now usable in $ClF_3$-based etching processes, in the etching of silicon substrates in particular, without the chlorine trifluoride having to be stockpiled. Moreover, the $ClF_3$ is generated in a highly efficient plasma reaction in a high-density plasma and may therefore be supplied directly subsequent to its generation to a process chamber which is assigned to the plasma reactor and in which it acts upon the semiconductor substrate situated there. Furthermore, due to the efficient reaction, the $ClF_3$ may be used in etching also with large gas flows of several 100 sccm (sccm=1 $cm^3$ gas flow/minute under normal pressure) up to slm (slm=1 $dm^3$ gas flow/minute under normal pressure), or it may be extracted from the device according to the present invention for generating $ClF_3$.

Furthermore, it is advantageous that, using the method according to the present invention and with the aid of the device according to the present invention, the chlorine trifluoride is producible from uncritical and cost-efficient gases which are available with a high degree of purity and which are used as precursor gases during the manufacture of $ClF_3$. Moreover, the device according to the present invention for generating chlorine trifluoride is easily implementable and reliably controllable using existing technology. In this respect, this device may be connected as a supplementary module upstream from any suitable etching chamber or existing vacuum system for etching semiconductor substrates, or it may be integrated as a supplementary component into a usual unit for supplying an etching chamber with process gases.

Advantageous refinements of the present invention arise from the measures cited in the subclaims.

It is particularly advantageous if the generation of the high-density plasma takes place in a reaction chamber inductively with the aid of a high-frequency excitation or via a microwave excitation using a hollow conductor and a magnetron.

Figure 1:
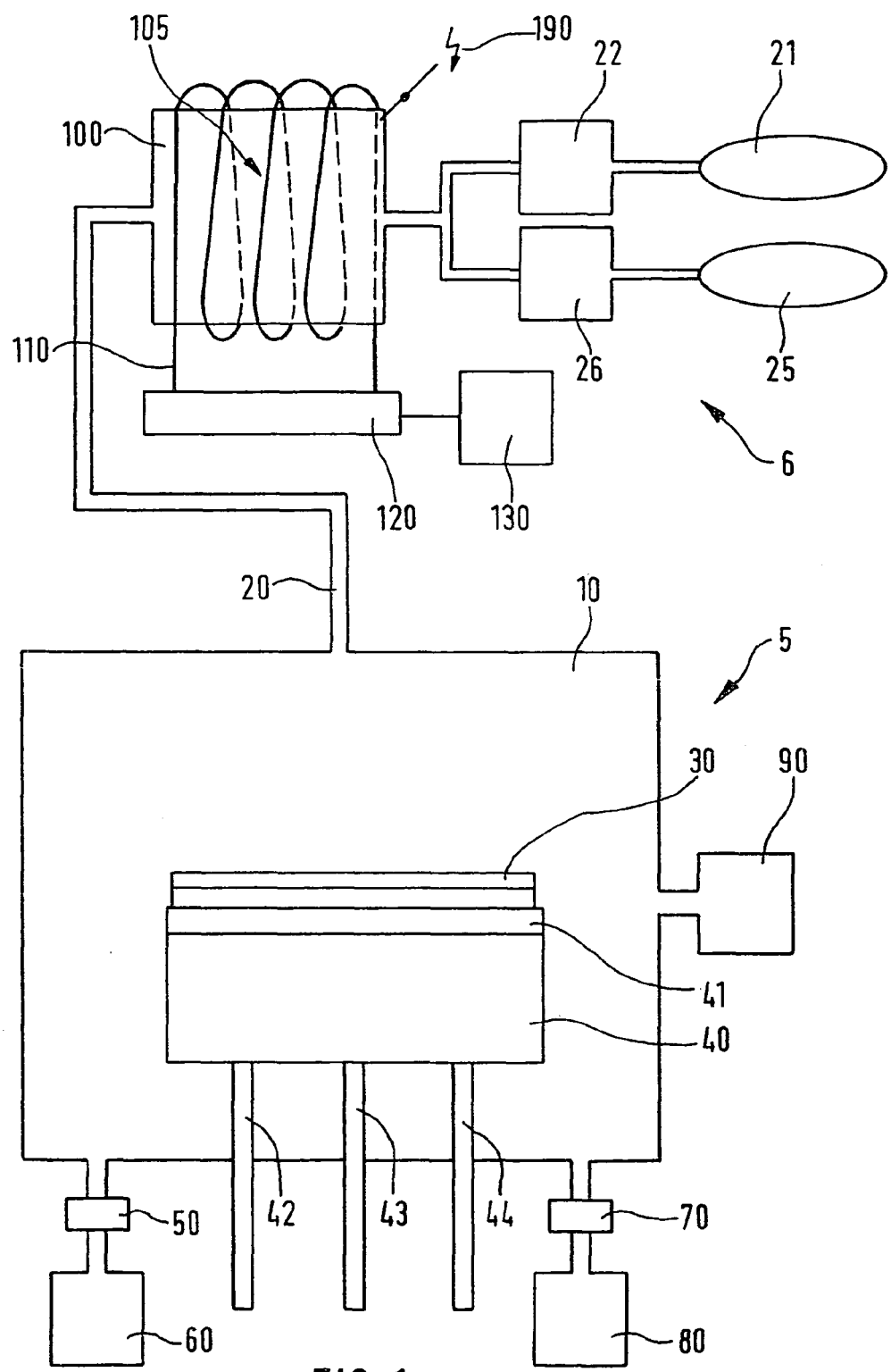
FIG. 1 shows a schematic sketch of a system for etching a semiconductor substrate including a device for generating chlorine trifluoride using inductive plasma excitation.

FIG. 1 schematically shows a first exemplary embodiment for a device 6 for generating chlorine trifluoride ($ClF_3$) upstream from a process chamber 10 in which a semiconductor substrate 30, preferably a silicon wafer, is etched, the silicon wafer being provided with a masking and/or a structuring, if needed. Device 6, together with process chamber 10, with which it is connected via a gas outlet 20, and later explained attachment parts form an etching system 5.

Core of device 6 is a plasma reactor 100 in the form of a reaction chamber. Using inductive high-frequency excitation or alternatively, according to FIG. 2, microwave excitation, supplied gases, known as precursor gases, are broken up as largely as possible in this reaction chamber into radicals which, at a corresponding ratio of fluoride portion to chlorine portion, i.e., preferably at a gas flow of 3:1 of gases releasing the respective fluoride radicals or corresponding reactive species or chlorine radicals or corresponding reactive species, compound to form $ClF_3$ and are subsequently supplied to process chamber 10.

In a first variant one starts out from gases $F_2$ and $Cl_2$ which are supplied to plasma reactor 100 via corresponding gas bottles 21, 25 for $F_2$ and $Cl_2$ and mass flow regulator 22, 26 downstream from gas bottles 21, 25.

The reaction takes place according to:

$$Cl_2 \rightarrow 2Cl^* \text{ and } F_2 \rightarrow 2F^*, F_2^*$$

The overall result of the reaction is the following:

$$Cl^* + F^*, F_2, F_2^* \rightarrow ClF_3$$

Due to the high plasma excitation density, which is achievable in a small plasma volume using inductive high-frequency excitation or microwave excitation, i.e., generation of a high-density plasma 105 having a density of radicals or reactive species of at least $10^{11}$ excited particles per $cm^3$, in particular at least $10^{12}$ excited particles per $cm^3$, a virtually complete conversion of the precursor gases $Cl_2$ and $F_2$ to $ClF_3$ is achieved when the ratio of the gas flows from $Cl_2$ to $F_2$ is set to a value of 1:3.

However, fluoride is not an optimal precursor gas, since it is not available with high purity, has corrosive and highly toxic properties, and needs high dissociation energy for the splitting or the radical formation.

In a second preferred variant, one starts out from precursor gases which, under plasma excitation, release fluoride radicals particularly efficiently and easily and at the same time in large quantities. The gases $SF_6$ or $NF_3$ are preferred as alternatives to $F_2$.

Under plasma excitation, $SF_6$ releases on average two fluoride radicals and devolves into the stable $SF_4$. Recombination reactions of fluoride radicals generated via $SF_4$, and therefore back reactions to a higher $SF_x$ in the direction of the starting material $SF_6$, thus the recapture of fluoride radicals already generated via $SF_4$, are unlikely since $SF_4$ is a stable final product and has only a comparably minor affinity with fluoride radicals. This property distinguishes $SF_6$ vis-à-vis other fluoride suppliers such as fluor(ohydro)carbons.

$ClF_3$ is built up in plasma reactor 100 according to the reactions:

$$SF_6 \rightarrow SF_4 + 2F^*$$

$$Cl_2 + F^* \rightarrow ClF + Cl^*$$

$$ClF + 2F^* \rightarrow ClF_3$$

$$Cl^* + F_2, F^* \rightarrow ClF_3$$

The overall result of the reactions is the following:

$$3SF_6 + Cl_2 \rightarrow 3SF_4 + 2ClF_3$$

$SF_6$ and $Cl_2$ are supplied to plasma reactor 100 at a ratio of the gas flows $SF_6:Cl_2$ of 3:1 in the sense of a stochiometric conversion to $ClF_3$.

A certain difficulty in this reaction is represented by the fact that, in high-density plasma 105, $SF_6$ is partially also degraded to lower $SF_x$ compositions (x=0, 1, 2, 3), in particular also to elementary sulfur, which, at the preferably as high as possible process pressures used in plasma reactor 100 or process chamber 10, may result in accumulations or, also on semiconductor substrate 30, in undesirable effects masking an etching operation. In order to circumvent such sulfur depositions, it is favorable in part to additionally feed oxygen to plasma reactor 100 or alternatively firstly to process chamber 10. It must be taken into account here that, due to the extraordinarily high selectivity of the $ClF_3$ etching reaction vis-à-vis $SiO_2$, an oxygen addition during etching of silicon may result in activated oxygen molecules or oxygen radicals oxidizing the silicon surface and thus also masking the etching operation using $ClF_3$.

Particularly during etching of silicon wafers using $ClF_3$, precursor gas $SF_6$ is not ideal since, in view of a high conversion efficiency to $ClF_3$, very high excitation densities, i.e., high plasma performance in a comparatively small volume, are sought and an added sulfur formation occurs particularly under these conditions.

Within the scope of a third, particularly preferred variant, $NF_3$ is used under adjustment of the gas flows instead of $SF_6$. In addition, although preferred to a lesser extent, a mixture of $SF_6$ with $NF_3$ is also usable. The gas $NF_3$ has the advantage that it cannot form any residues, such as sulfur, during the reaction of $Cl_2$ to $ClF_3$ for example. Moreover, nitrogen trifluoride is frequently used in semiconductor processes as a purgation gas, i.e., it is inexpensive, stable, available in highly pure form, not corrosive, and is considered to be less toxic.

$NF_3$ acts totally different at low plasma densities than at high plasma densities. Fragments of the form $NF_x$, which may also have a radical nature ($NF_x^*$), dominate the plasma chemistry of $NF_3$ at low plasma densities. The fragments features are low selectivity vis-à-vis dielectrics, a comparatively low efficiency of the silicon removal due to relatively small amounts of available free fluoride radicals because of a distinct tendency to recombination reactions to the starting product or to interim products having a higher fluoride content, and an extremely aggressive behavior toward organic materials. The sum of these properties renders $NF_3$ to be an excellent purgation gas for plasma deposition systems and a scavenger gas in etching applications in which the excitation densities are generally comparatively low. The reaction in the plasma at low plasma densities thus takes place as follows:

$$NF_3 \leftarrow \rightarrow NF_x^{(*)} + (3-x)F^* \text{ where } x=1,2,3$$

In contrast, fluoride radicals and $N_2$ dominate as final products in high excitation densities or plasma densities. In this case, $NF_3$ is completely broken up in the plasma which results in a highly efficient formation of fluoride radicals and nitrogen molecules, the latter being able to be neglected in the following discussions due to their high chemical stability. A subsequent capture reaction of fluoride radicals including a back reaction in the direction of the starting product is prevented in particular due to the formation of the stable $N_2$ molecule, i.e., similar to the case of $SF_6$, the tendency toward recombination reactions is only minimally defined by the stable final product of $NF_2$. Also in the case of the reactions of the generated $ClF_3$ with silicon, the presence of nitrogen may be neglected. The reaction in the plasma at high plasma densities thus takes place as follows:

$$2NF_3 \rightarrow N_2 + 6F^*$$

$$Cl_2 + 6F^* \rightarrow 2ClF_3$$

$$2NF_3 + Cl_2 \rightarrow 2ClF_3 + N_2$$

For an ideal stochiometric conversion, the ideal ratio of the gas flows from $NF_3$ to $Cl_2$ is 2:1.

For use in plasma reactor 100 with high excitation density, i.e., in which a high-density plasma 105 is present, $NF_3$ is thus a particularly advantageous gas which, together with $Cl_2$ as an additional gas, results in highly efficient $ClF_3$ generation. It provides large amounts of fluoride radicals under these conditions and does not result in the formation of undesirable contaminations or residues.

Furthermore, gaseous hydrogen chlorine (HCl) is also suitable as a reaction partner of the $NF_3$, or also of the $SF_6$ or $F_2$ as an alternative to $Cl_2$. This gas has the advantage over $Cl_2$ that it is less dangerous, i.e., it is noticeable immediately by its sour smell and is less toxic. Moreover, HCl is markedly less corrosive than chlorine, but here also, a concurrence with moisture must always be carefully avoided. The use of HCl together with $NF_3$ results in the formation of $ClF_3$, gaseous hydrogen fluoride (HF) being formed in a side reaction, according to the following reaction equation:

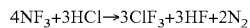

$$4NF_3 + 3HCl \rightarrow 3ClF_3 + 3HF + 2N_2$$

For a stochiometric conversion, the ideal ratio of the gas flows from $NF_3$:HCl is 4:3. In addition to the unremarkable nitrogen, HF as a final product is also added to the generated chlorine trifluoride. This escort gas may be tolerated as a rule, since anhydride (dry) HF does not generally interfere in the etching reaction of the $ClF_3$ with silicon and does not attack oxides or corrode metal surfaces without the presence of moisture. In the event that HF is undesirable as a gas component, it may be selectively removed from the gas generated in the plasma reactor with the aid of a suitable filter, via absorption on alkali fluorides or metal fluorides (NaF+HF-→NaHF$_2$), for example.

The execution of the last presented method is explained in greater detail in connection with FIG. 1. Via an assigned first mass flow regulator 22 or an assigned second mass flow regulator 26, the gas $NF_3$ is extracted from a first gas reservoir 21, a gas bottle, for example, and the gas $Cl_2$ or HCl is extracted from a second gas reservoir 25, a gas bottle, for example, and supplied to plasma reactor 100, HF being generated due to the high-density plasma excitation of the two supplied precursor gases and due to the conversion of the plasma fragments into $ClF_3$ and $N_2$, also in the case of HCl, the HF being supplied via gas outlet 20, which may also be referred to or may also be used as a connecting tube, to actual process chamber 10 for etching semiconductor substrate 30.

Gas outlet 20 is preferably designed as a metallic tube which separates high-density plasma 105, i.e., plasma reactor 100, from process chamber 10. On the way from plasma reactor 100 to process chamber 10, at least a portion of the charged particles in high-density plasma 105 is discharged in gas outlet 20, thereby electrically decoupling process chamber 10 from plasma reactor 100. Furthermore, metallic netting, used for the further or complete electrical decoupling of process chamber 10 from plasma reactor 100, may alternatively or additionally be inserted into gas outlet 20.

In this connection, FIG. 1 shows an inductively coupled, high-frequency-excited plasma reactor 100, a coil 110, with which a high-frequency power or a high-frequency electromagnetic alternating field is injected into the interior of reactor 100, being wound around a tube made of silica glass or preferably of an aluminum oxide ceramic, its inner wall preferably being polished for avoiding the generation of particles. Over a large working range of the pressure and the gas flows, the alternating field drives a high-density inductive plasma 105 in reactor 100. The coupling of the high frequency, generated by a high frequency generator 130, to coil 110 takes place via a usual adaptor network 120 known as a "matchbox," which ensures the impedance adaptation of the output of the high frequency generator to inductive plasma 105. Depending on the gas flow, preferred high frequency powers are between 200 watts and 3 kW, a frequency of 13.56 MHz being used, for example. The gas flows of the precursor gases $NF_3$ and $Cl_2$ or HCl into plasma reactor 100 are preferably between 100 sccm and 1 slm $NF_3$ and, corresponding to the ideal stochiometric mixing ratio of 2:1 vis-à-vis $Cl_2$ and 4:3 vis-à-vis HCl, between 50 sccm and 500 sccm $Cl_2$, and 75 sccm and 750 sccm HCl. The working pressures in plasma reactor 100 correspond to the pressures preferably used in process chamber 10, i.e., they are between 1 mbar and 100 mbar, preferably between 10 mbar and 30 mbar. At this pressure, high-density inductive plasmas are able to still be operated in a stable manner in tubes having diameters of several cm up to approximately 10 cm and correspondingly high excitation density. Ignition of high-density plasma 105 may be facilitated by using an auxiliary electrode 190, in particular in the form of a metal point, which is integrated into process chamber 100, high voltage pulses, e.g., from an inductor or an ignition coil, being applied to auxiliary electrode 190.

Figure 2:
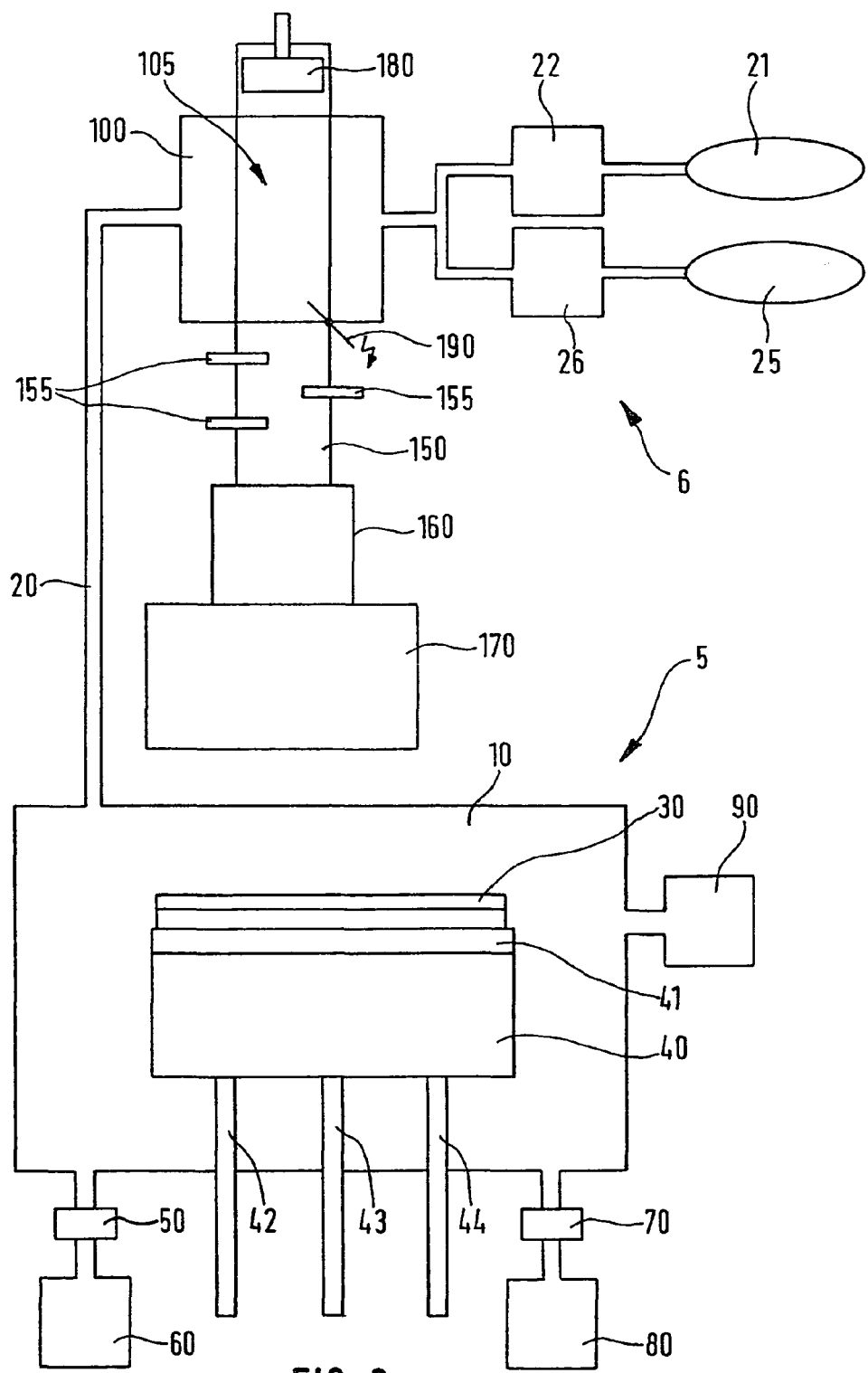
FIG. 2 shows a schematic sketch of an alternative system for etching a semiconductor substrate including a device for generating chlorine trifluoride, the plasma excitation taking place via microwaves.

FIG. 2 shows a second possibility for generating high-density plasma 105. A tubular plasma reactor 100 made of silica glass or preferably an aluminum oxide ceramic is used for this purpose; attention must be paid to good surface quality, i.e., polished interior walls of plasma reactor 100 in particular in the case of an aluminum oxide tube. This results in particularly favorable microwave properties of plasma reactor 100 since the microwave conduction responds very sensitively to the surface quality over the entire length of tubular reactor 100 in a boundary layer between the dielectric wall and the generated plasma ("surfatron effect"). In addition, a particularly high quality aluminum oxide ceramic having an $Al_2O_3$ portion of more than 99.5%, preferably more than 99.9%, is preferably used to avoid undesirable microwave absorptions and to boost the "surfatron effect."

According to FIG. 2, tubular plasma reactor 100 traverses in a cross configuration a microwave hollow conductor 150 which is fed microwave power from a magnetron 170 via a circulator 160 for mode field adaptation and separation of forward power and reverse power. In addition, hollow conductor 150 has an adjustable hollow conductor terminating element 180, known as a terminator, as well as tuning elements 155, known as studs, for adapting to high-density plasma 105 generated in plasma reactor 100 and for optimum adjustment of the surfatron effect. Due to the microwave field expansion, high-density plasma 105 is formed at least almost on the entire length of tubular plasma reactor 100. Hollow conductor 150 has a through-bore at a suitable place, so that plasma reactor 100 may be inserted. Moreover, suitable microwave shields (not shown) against the surroundings are to be provided to make safe operation possible. In a longitudinal configuration, plasma reactor 100 is situated inside hollow conductor 150, i.e., between tuning elements 155 and hollow conductor terminating element 180.

Due to the adjustment of tuning elements 155 and corresponding positioning of hollow conductor terminating element 180, it is achieved that plasma reactor 100 is situated in a favorable field area, thus ensuring efficient plasma excitation. Microwave powers of 200 W to 6 kW at a frequency of preferably 2.45 GHz are preferably used since cost-effective high-powered magnetrons 170 are available at this frequency. Here also, as explained above, ignition of high-density plasma 105 may be facilitated by using an auxiliary electrode 190 which is integrated into process chamber 10 as explained above.

In the exemplary embodiment according to FIG. 1 as well as according to FIG. 2, process chamber 10 has a substrate electrode 40 onto which a silicon wafer as semiconductor substrate 30 may be clamped. This clamping preferably takes place via a clamping device 41, an electrostatic chuck, for example, which also protects the supported side of semiconductor substrate 30 from the gases in process chamber 10. In addition, He is preferably applied to the supported side of semiconductor substrate 30 to achieve a good thermal connection to substrate electrode 40 and additional insulation against the gases of process chamber 10.

Substrate electrode 40 additionally has electric feeds and lead-aways 42 for clamping device 41 and possibly an electric heater which may be provided in substrate electrode 40 for temperature control or temperature adjustment. Measuring data, e.g., the electrode temperature or the helium back pressure, may preferably be transmitted to the outside via electric feeds or lead-aways 42.

Furthermore, substrate electrode 40 has a gas inflow and a gas outflow 43, via which preferably He as a convection medium for cooling semiconductor substrate 30 is able to be supplied or removed using an adjustable pressure.

An additional inflow and outflow 44 allows the circulation of a coolant through substrate electrode 40 to adjust its temperature and, in particular, to dissipate reaction heat from an exothermal etching reaction occurring on semiconductor substrate 30. For ideal etching conditions and masking selectivity, the substrate temperature is preferably −30° C. to 30° C. Fluorinerts® or ethylene glycol water-mixtures may be used as coolants.

Furthermore, process chamber 10 has two pump stations including a first pump 60, a turbo molecular pump in particular, and a second pump 80, a rotary vane pump in particular, which may be coupled in the sense that rotary vane pump 80 may also temporarily be used as a roughing pump for turbo molecular pump 60. Rotary vane pump 80, which is preferably designed as a dry running pump, is used for "roughing" entire system 5 after venting and as a process pump to evacuate the process gases during execution of an etching process. A control valve 70 is used for pressure regulation. The pressure measurement takes place via a manometer 90 which may be designed as a Baratron or a combination of Baratron and Ionivac. Manometer 90 and control valve 70 are used to solidly set the desired process pressure of preferably 5 mbar to 100 mbar, in particular 10 mbar to 30 mbar, during processing of semiconductor substrate 30.

Turbo pump 60, in connection with a stop valve 50, is used to achieve an end vacuum as good as possible before and after processing, e.g., better than $10^{-4}$ Pa. This is important since, as mentioned, residual moisture in process chamber 10 or on semiconductor substrate 30 interrupts the executed etching process and, on the other hand, residues of the process gases should be eliminated prior to unloading semiconductor substrate 30. During the process, turbo pump 60 is cut off from process chamber 10 via stop valve 50 since it is unusable at process pressures in the mbar range.

Processing of a silicon wafer as semiconductor substrate 30 in process chamber 10, including the explained components which form etching system 6, is explained in greater detail in the following, the explained device 5 for generating ClF3 being situated upstream from etching system 6.

The silicon wafer is initially planted into etching system 6 and clamped onto substrate electrode 40. Turbo pump 60 then pumps chamber 10 and the connected mimic of the gas supply with plasma reactor 100 until the intended base vacuum is achieved. Valve 50 is then closed and turbo pump 60 is shut off. Using mass flow regulator 22, 26, the desired quantities of process gases are now supplied, e.g., 100 sccm to 1 slm of $NF_3$ and 50 sccm to 500 sccm of $Cl_2$, or 75 sccm to 750 sccm of HCl. Moreover, after stabilization of the gas flows, the plasma reaction in plasma reactor 100 is started by switching on high-frequency generator 130 to the inductive plasma source or coil 110, or by switching on magnetron 170 to hollow conductor 150. The pressure in process chamber 10 and thus also in upstream plasma reactor 100 is measured using manometer 90 and stabilized at the intended value using the combination of rotary vane pump 80 and control valve 70. The silicon wafer is then etched by supplying the $ClF_3$ which is generated in plasma reactor 100 from the precursor gases. The high-frequency or microwave supply to plasma reactor 100 is subsequently shut off, the process gas supply is stopped, and process chamber 10 and the mimic of the gas supply with plasma reactor 100 is pumped dry. Finally, with valve 50 open, turbo pump 60 takes over pumping to an end pressure as low as possible, better than $10^{-4}$ Pa for example. Control valve 70 upstream from rotary vane pump 80 is closed, i.e., rotary vane pump 80 may be used as a fore-pump for turbo pump 60 during this time. The silicon wafer is unloaded into a connected lock device when the base pressure is reached.

What is claimed is:

1. A device for generating chlorine trifluoride comprising:
   a plasma reactor (100);
   plasma generating means (110, 120, 130, 150, 155, 160, 170, 180) via which a high-density plasma (105) can be generated in the interior of the plasma reactor (100);
   a first gas;
   a second gas selected to react with the first gas to form chlorine trifluoride when under the influence of a high-density plasma; and
   gas supply means (21, 25, 22, 26) via which the first gas and the second gas can be supplied to the plasma reactor (100), these gases reacting with one another under the influence of the high-density plasma (105) in the plasma reactor (100), forming chlorine trifluoride, and a gas outlet (20) via which the formed chlorine trifluoride can be removed from the plasma reactor (100), the gas supply means including
   a first mass flow regulator configured to regulate the first gas to a first flow rate to the plasma reactor, and
   a second mass flow regulator configured to regulate the second gas to a second flow rate to the plasma reactor,
   wherein the first flow regulator and the second flow regulator are configured to regulate the respective first and second flow rates to provide an ideal stoichiometric conversion of the first gas and the second gas to chlorine trifluoride.

2. The device according to claim 1, wherein the plasma generating means include a coil (110), an adaptation network (120), and a high-frequency generator (130).

3. The device according to claim 1, wherein the plasma generating means include a microwave hollow conductor (150), tuning elements (155), a magnetron (170), a circulator (160), and a hollow conductor terminating element (180).

4. The device according to claim 1, wherein the plasma reactor (100) includes a quartz tube or a hollow quartz body having a polished interior wall or a ceramic tube or a hollow ceramic body having a polished interior wall or being made of aluminum oxide.

5. The device according to claim 1, wherein first mass flow regulator (22) is adjustable, and the second mass flow regulator (26) is adjustable.

6. A system for etching semiconductor substrates, comprising: the device (6) according to claim 1, a process chamber (10), which is connected to the plasma reactor (100) via the gas outlet (20), being assigned to it, the semiconductor substrate (30) being situated in the process chamber (10) and being exposed to the gaseous chlorine trifluoride generated by the device (6) for generating chlorine trifluoride.

7. A method for generating chlorine trifluoride, comprising: generating a high-density plasma (105) in a plasma reactor (100), and supplying to the plasma reactor (100) a first gas and a second gas, which react with one another under the influence of the high-density plasma (105) in the plasma reactor (100), forming chlorine trifluoride, a ratio of the amount of the first gas and the amount of the second gas being selected to achieve an ideal stoichiometric conversion to chlorine trifluoride.

8. The method according to claim 7, wherein the high-density plasma (105) is generated using inductive high-frequency excitation or microwave excitation.

9. The method according to claim 7, wherein a gas which includes $Cl_2$ or HCl is used as the first gas, and a gas which includes $NF_3$, $F_2$, $SF_6$ is used as the second gas.

10. The method according to claim 7, wherein oxygen as an additional gas is supplied to the plasma reactor (100) or to a process chamber (10) downstream from the plasma reactor (100).

11. The method according to claim 7, wherein the generated chlorine trifluoride is separated from hydrogen fluoride and other gas components, using a filter downstream from the plasma reactor (100).

12. The method according to claim 7, wherein the first gas and the second gas are supplied to the plasma reactor (100) in such a way that fluoride atoms and chlorine atoms, in the form of radicals or reactive species, are present in the high-density plasma (105) at a 3:1 ratio.

13. The method according to claim 7, wherein the high-density plasma (105) is generated having a density in radicals or reactive species of at least $10^{11}$ particles per $cm^3$, in particular at least $10^{12}$ particles per $cm^3$.

14. A method of generating chlorine trifluoride, comprising:
   generating a high-density plasma in a plasma reactor;
   supplying to the plasma reactor a first gas according to a first gas flow rate; and
   supplying to the plasma reactor a second gas according to a second gas flow rate, wherein
   the first gas and the second gas react with one another under the influence of the high-density plasma to form chlorine trifluoride in the plasma reactor, and
   a ratio of the first gas flow to the second gas flow is selected to achieve an ideal stoichiometric conversion to chlorine trifluoride.

15. The method of claim 14, further comprising:
supplying the chlorine trifluoride gas from the plasma reactor to a process chamber, wherein a gas flow of the chlorine trifluoride from the plasma reactor to the process chamber is greater than 100 sccm.

16. A method comprising:
generating a high-density plasma in a plasma reactor;
supplying to the plasma reactor a first gas; and
supplying to the plasma reactor a second gas;
reacting the first gas and the second gas under the influence of the high-density plasma to form chlorine trifluoride in the plasma reactor; and
transferring the formed chlorine trifluoride to a process chamber assigned to the plasma reactor;
etching a silicone substrate in the process chamber using the formed chlorine trifluoride as an etching gas.

17. The method of claim 16, wherein:
the first gas is supplied to the plasma reactor according to a first gas flow rate;
the second gas is supplied to the plasma reactor according to a second gas flow rate; and
a ratio of the first gas flow to the second gas flow is selected to achieve an ideal stoichiometric conversion to chlorine trifluoride.

18. The method of claim 16, wherein a gas flow of the chlorine trifluoride from the plasma reactor to the process chamber is greater than 100 sccm.

* * * * *

UNITED STATES PATENT AND TRADEMARK OFFICE
CERTIFICATE OF CORRECTION

PATENT NO. : 8,382,940 B2  Page 1 of 1
APPLICATION NO. : 10/519724
DATED : February 26, 2013
INVENTOR(S) : Franz Laermer It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 2051 days.

Signed and Sealed this
First Day of September, 2015

Michelle K. Lee
*Director of the United States Patent and Trademark Office*